US009496837B2

(12) United States Patent
Qureshi

(10) Patent No.: US 9,496,837 B2
(45) Date of Patent: Nov. 15, 2016

(54) DOHERTY AMPLIFIER

(71) Applicant: Ampleon Netherlands B.V., Nijmegen (NL)

(72) Inventor: Jawad Qureshi, Gelderland (NL)

(73) Assignee: Ampleon Netherlands B.V., Nijmegen (NL)

( * ) Notice: Subject to any disclaimer, the term of this patent is extended or adjusted under 35 U.S.C. 154(b) by 0 days.

(21) Appl. No.: 14/301,423

(22) Filed: Jun. 11, 2014

(65) Prior Publication Data

US 2015/0002230 A1    Jan. 1, 2015

(30) Foreign Application Priority Data

Jun. 26, 2013   (EP) .................................... 13173865

(51) Int. Cl.
| | |
|---|---|
| *H03F 3/68* | (2006.01) |
| *H01L 23/66* | (2006.01) |
| *H03F 1/02* | (2006.01) |
| *H03F 1/48* | (2006.01) |

(Continued)

(52) U.S. Cl.
CPC ................ *H03F 3/68* (2013.01); *H01L 23/66* (2013.01); *H03F 1/0288* (2013.01); *H03F 1/483* (2013.01); *H03F 1/56* (2013.01); *H03F 3/193* (2013.01); *H03F 3/245* (2013.01); *H01L 2223/6655* (2013.01); *H01L 2924/0002* (2013.01); *H03F 1/07* (2013.01); *H03F 2200/111* (2013.01); *H03F 2200/222* (2013.01); *H03F 2200/36* (2013.01); *H03F 2200/387* (2013.01); *H03F 2203/21103* (2013.01); *H03F 2203/21106* (2013.01)

(58) Field of Classification Search
CPC ........ H03F 3/211; H03F 3/602; H03F 3/604; H03F 3/72; H03F 1/0288; H03F 3/24; H03F 2200/451; H03F 3/68; H03F 3/605; H03F 1/07
USPC ............................................... 330/124 R, 295
See application file for complete search history.

(56) References Cited

U.S. PATENT DOCUMENTS

| 8,228,123 B2 * | 7/2012 | Blednov ................ H03F 1/0288 |
| | | 330/124 R |
| 8,314,654 B2 * | 11/2012 | Outaleb et al. ........... 330/124 R |

(Continued)

FOREIGN PATENT DOCUMENTS

| EP | 2 463 905 A1 | 6/2012 |
| WO | 2008/062371 A2 | 5/2008 |

OTHER PUBLICATIONS

Monzon, Cesar; "A small dual-frequency transformer in two sections"; IEEE Trans. on Microwave Theory and Tech. vol. 51, No. 4; pp. 1157-1161 (Apr. 2003).

(Continued)

*Primary Examiner* — Khanh V Nguyen
(74) *Attorney, Agent, or Firm* — McDonnell Boehnen Hulbert & Berghoff LLP

(57) ABSTRACT

A Doherty amplifier has at least one peaking amplifier which has first and second drain connections, wherein the first drain connection is connected to the output network, and the other second drain connection is connection to the load. By providing two drain connections, separate package leads to the peaking amplifier can be taken into account when designing the impedance inverter and an output impedance. In this way, the circuit operation can be optimized both for the impedance inversion function and for driving the output load.

9 Claims, 8 Drawing Sheets

(51) Int. Cl.
*H03F 1/56* (2006.01)
*H03F 3/193* (2006.01)
*H03F 3/24* (2006.01)
*H03F 1/07* (2006.01)

(56) References Cited

U.S. PATENT DOCUMENTS

| | | | | |
|---|---|---|---|---|
| 8,482,353 | B2* | 7/2013 | Blednov | 330/295 |
| 8,487,703 | B2* | 7/2013 | Blednov | H01L 23/64 |
| | | | | 330/124 R |
| 8,717,102 | B2* | 5/2014 | Wilson | H03F 3/193 |
| | | | | 330/124 R |

| | | |
|---|---|---|
| 2009/0045878 A1 | 2/2009 | Shiikuma |
| 2010/0200979 A1 | 8/2010 | Blair et al. |
| 2012/0126890 A1 | 5/2012 | Svechtarov |

OTHER PUBLICATIONS

Qureshi, J. H.; "A wideband 20W LDMOS Doherty Power Amplifier"; IMS2010; pp. 1504-1507 (2010).
Doherty, W. H.; "A new high efficiency power amplifier for modulated waves"; Proceedings of the Institute of Radio Engineers, vol. 24, No. 9; pp. 1163-1182 (Sep. 1936).
Extended European Search Report for Application No. 13173865.0 (Sep. 3, 2013).

* cited by examiner

DOHERTY AMPLIFIER

CROSS-REFERENCE TO RELATED APPLICATIONS

This application claims the priority under 35 U.S.C. §119 of European patent application no, 13173865.0 filed on Jun. 26, 2013, the contents of which are incorporated by reference herein.

The invention relates to an electronic device comprising a Doherty Amplifier ("DA") with an amplifier input and an amplifier output, wherein the amplifier has a main stage, and at least one peaking stage.

An amplifier of this type has an input network connecting the amplifier input to an input of the main stage and to an input of the peaking stage. An output network connects an output of the main stage and an output of the peaking stage to the amplifier output.

A classical DA has two amplifying stages arranged in parallel and of the same power capability. The first one of the stages (main stage) operates in a class-AB amplifier mode and the second one (peaking stage) operates in a class-C amplifier mode.

These stages are separated at their inputs and at their outputs by 90 degree phase shifting networks. The output phase shifting network has a specific characteristic impedance Zo which must be equal to the optimal load impedance RLm of the main stage. The input signal is split so as to drive the two amplifiers, and a summing network, known as an "impedance inverter" or a "Doherty combiner", is operative to:

a) combine the two output signals, b) correct for phase differences between the two output signals, and c) provide an inverted impedance at the output of the DA with respect to the impedance as seen from the output of the main stage.

The Doherty amplifier addresses the problem that signals with significant amplitude modulation result in low average efficiency for the traditional power amplifier.

The classical Doherty amplifier is a so-called 2-way amplifier with a main stage and a single peaking stage. A multi-way (or N-way) Doherty amplifier has a main stage and a plurality of peaking stages operating in parallel. An advantage of a multi-way Doherty system is that it extends the back-off level beyond the symmetrical two way design without exhibiting significant drop in efficiency between the efficiency peaking points. As a result, an improvement of efficiency is possible at 12 dB power back-off, not at 6 dB back-off as for a symmetrical 2-way Doherty amplifier. The 12 dB power back-off is currently demanded by new communication systems such as 3 G-LTE (third generation long-term evolution) and WiMAX (Worldwide Interoperability for Microwave Access).

Typically, the main stage and the peaking stages are implemented using a respective power transistor as each of the respective stages.

An equivalent circuit of the classical two-way Doherty architecture is shown in FIG. 1. Two Power Amplifiers ("PAs"); a main amplifier 10 and a peaking amplifier 12 of equal power capacity, are driven by the input, with a λ/4 line at the input of the peaking amplifier 12 (not shown in the equivalent circuit). This functions as an impedance aligner. An impedance inverter 16 combines the output.

FIG. 2 shows the instantaneous efficiency of the two-way Doherty power amplifier of FIG. 1 (plot 20) as well as the efficiency of an ideal class-B amplifier (plot 22). The input λ/4 line dynamically modulates the load impedances of both main and peaking amplifiers as the input power level changes, improving the efficiency at back-off as shown in FIG. 2.

Doherty amplification is thus a well known technique for improving the power efficiency of RF transmitters when dealing with modulated signals that have high peak-to-average ratios e.g. MC-GSM, WCDMA and OFDM. In this context, power efficiency is defined as the ratio of average output power of the power amplifier to the DC input power. In these applications, the Doherty power amplifiers are applied to broadcast applications at sub-gigahertz frequencies for improving the average efficiency. The concept is very successful in improving the average efficiency of the transmitters and can provide average efficiencies more than 50% for the modern WCDMA and MC-GSM signals and is being widely used in the current cellular as well as broadcast base-station transmitters.

However, the requirements of microwave transmitters are now shifting towards wider RF bandwidths along with high average efficiencies. For example, transmitted signals for the next generations of base-station transmitters have bandwidths in excess of 100 MHz and if the pre-distortion overhead on the bandwidth is included, the power amplifier for those signals need to handle signal bandwidths of more than 400 MHz.

Additionally, there is also a growing demand for multi-band high average efficiency power amplifiers. For example, in broadcast applications a multi-band amplifier is required which can operate over a very wide bandwidth e.g. from 460 MHz to 860 MHz with an average efficiency drop of no more than 10 percentage points from its maximum value, and peak power drop of not more than 0.5 dB in the band.

The current Doherty power amplifier implementations can provide high average efficiency, but their bandwidth performance is inadequate for the future needs of the base-stations and broadcast transmitters. For example the current high-power implementations cannot provide fractional efficiency bandwidths of more than 10% (assuming 10% drop of efficiency within the band). Note that this bandwidth is calculated at the average power levels, as the Doherty PA shows worst bandwidth limitations at these power levels.

Fractional bandwidth is defined as $$BW = \frac{\Delta\omega}{\omega_C}$$

where $\omega_c$ is the center frequency. $\Delta\omega=\omega_2-\omega_1$ ($\omega_1$ and $\omega_2$ are frequencies where the relative efficiency drops by 10%.

It has been shown that the Doherty PA concept, in its most basic form, can provide the relative efficiency bandwidth of 28%.

This bandwidth can be improved by using more complicated wideband impedance inverters. This approach is disclosed in US 2012/0126890. The impedance inverter comprises the basic impedance inverter 16 shown in FIG. 1 and another electromagnetically coupled transmission line which also connects to the load. When using this wideband impedance inverter with the basic schematic of FIG. 1, the bandwidth of the Doherty PA can be further improved.

However, the bandwidth of the impedance inverter is not the only limiting factor for the bandwidth of the high-power Doherty PAs. It was also shown in US 2012/0126890 that if the amplifier is made with bare dies and the output capacitances can be absorbed in the impedance inverter, the bandwidth of the Doherty PA can approach the theoretical limit of what can be achieved by using the quarter wave transmission line. However the technique cannot be directly applied to an amplifier implemented using packaged high-power PA devices, in particular as a result of the parasitic impedances associated with the package leads.

SUMMARY

This invention aims to broaden the bandwidth of the high power Doherty PA by the use of a specialized layout and packaging.

According to the invention, there is provided an amplifier as claimed in claim 1.

The invention provides a Doherty amplifier for driving a load comprising:
a main amplifier;
at least one peaking amplifier;
an input network connecting the Doherty amplifier input to the input of the main amplifier and to the input of the at least one peaking amplifier; and
an output network connecting an output of the main amplifier and an output of the at least one peaking amplifier, wherein the at least one peaking amplifier comprises first and second drain connections, wherein the first drain connection is connected to the output network, and the second drain connection is connected to the load.

By providing a peaking amplifier with two drain outputs, the bandwidth of the Doherty Power Amplifier can be increased. One drain output is used with the main amplifier to form the wideband impedance inverter required for the Doherty PA operation and the other drain output is used to connect to the RF load.

A transmission network can be provided between the second drain output and the load, in particular a wideband impedance transformation network. The choice of proper matching network at the second drain output can provide a relative bandwidth in excess of 45%.

The output network can comprise a first phase shifting element between the output of the main amplifier and the Doherty amplifier output, and a second phase shifting element electromagnetically coupled to the first phase shifting element, and in series to the Doherty amplifier output. This output network (impedance inverter) gives improved operation of the wavelength band or enables an increased wavelength band.

A third phase shifting element can be in series between the second phase shifting element and the Doherty amplifier output.

The invention also provides an amplification method using a Doherty amplifier having a main amplifier and at least one peaking amplifier having first and second drain connections, the method comprising: connecting the Doherty amplifier input to the input of the main amplifier and to the input of the at least one peaking amplifier through an input network;

connecting an output of the main amplifier and an output of the at least one peaking amplifier using an output network; and connecting the first drain connection of the peaking amplifier to the output network and connecting the second drain connection of the at least one peaking amplifier to a load.

BRIEF DESCRIPTION OF THE DRAWINGS

Examples of the invention will now be described in detail with reference to the accompanying drawings, in which.

DETAILED DESCRIPTION

The invention provides a Doherty amplifier which has at least one peaking amplifier which has first and second drain connections, wherein the first drain connection is connected to the output network, and the second drain connection is connection to the load. By providing two drain connections, separate package leads to the peaking amplifier can be taken into account when designing the impedance inverter and an output impedance. In this way, the circuit operation can be optimised both for the impedance inversion function and for driving the output load.

Before explaining the details of this invention a description will first be provided concerning the bandwidth limiting factors for a high-power Doherty PA constructed using packaged PA devices. For this purpose, a schematic diagram of a conventional high-power Doherty PA is shown in the FIG. 3.

$L_{b1}$ and $L_{b2}$ represent the parasitic bond-wire inductances resulting from the connection of the RF power transistor to the package lead, $C_{pkg}$ represents the capacitance of the packaged lead and $C_d$ represents the output capacitance of the power amplifier ("PA") devices.

Figure 3:
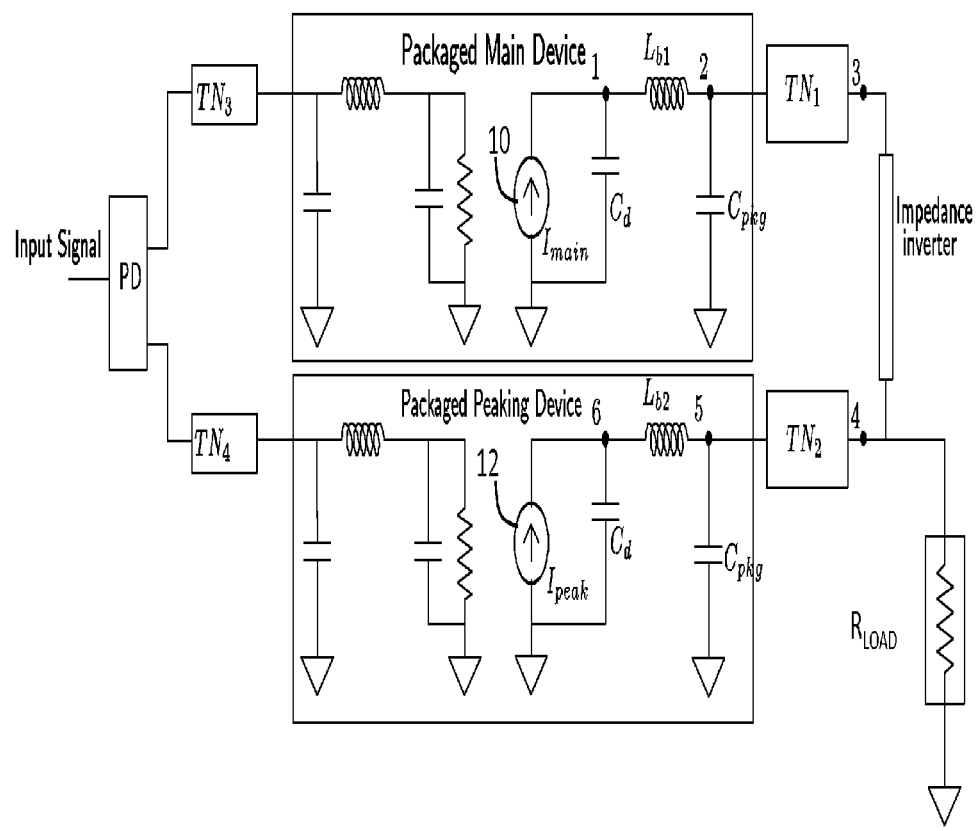
FIG. 3 shows a known component layout for a packaged two way Doherty power amplifier circuit.

Six nodes are labelled in FIGS. 3 as 1 to 6.

The inductors Lb1, Lb2, the package capacitors Cpkg and the capacitors Cd are inside the package. Outside the package are transmission lines TN2 and TN2 which are connected between the main and peaking devices to form the remaining part of the impedance inverter.

The device parasitic capacitance $C_d$ along with the package parasitic $L_{b1}$ and $C_{pkg}$ cause undesired rotation of the impedances from the node 2 to the internal current source (node 1), thereby disturbing the Doherty PA operation. Therefore in order to apply correct load modulation at the internal current source, a passive transformation network ($TN_1$) is inserted between the impedance inverter and the package lead which makes the total transformation from the node 1 to the node 3 equal to zero or 180° at the operating frequency.

Moreover, a similar network ($TN_2$) is added at the peaking device, in order to present high impedance to the main device under power back-off conditions (when the peaking device is off). This approach works well at the designed frequency, but the frequency response of the networks $TN_1$ and $TN_2$ severely limits the bandwidth performance of the Doherty PA, and in practice the bandwidth of the Doherty PA is more limited by the bandwidth of the transformation networks $TN_1$ and $TN_2$ rather than the impedance inverter itself.

Therefore, the use of a wideband impedance inverter as disclosed in US 2012/0126890 in such conventionally designed Doherty PA circuits do not show optimum bandwidth improvements. Similarly, the dual band inverters presented in the paper "A small dual-frequency transformer in two sections", C Monzon, IEEE Trans. on Microwave Theory and Tech. vol 51, April 2003, pp 1157-1161 do not give rise to the desired bandwidth improvements.

This invention aims to eliminate the networks $TN_1$ and $TN_2$ by the use of specialized layout and packaging of the peaking device, including a circuit connection scheme, in order to improve the bandwidth of the Doherty PA constructed with this device.

The invention provides a modified Doherty PA configuration which can directly benefit from the use of the improved wideband and multi-band impedance inverters disclosed in the references above, and provides a significantly improved bandwidth performance.

Figure 4:
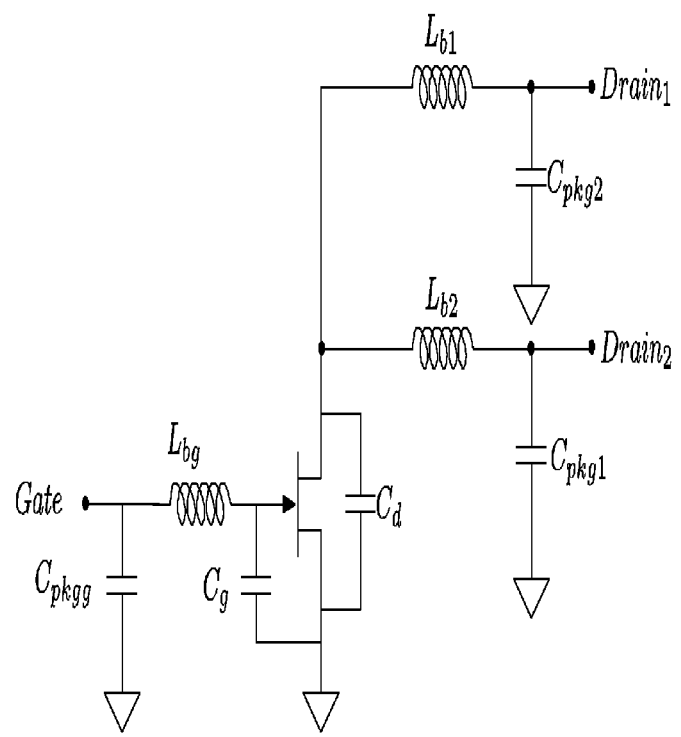
FIG. 4 shows a peaking amplifier stage in accordance with the invention.

The invention provides a peaking amplifier with two output leads as shown in FIG. 4.

The power amplifier transistor is shown, with two drain connections Drain1 and Drain2. Each of these is associated with a bond wire with inductance and capacitance.

$C_d$ in FIG. 4 represents the output capacitance of the power amplifier device, $L_{b1}$ and $L_{b2}$ are the bond-wire inductances and $C_{pkg1}$ and $C_{pkg2}$ are the package parasitic capacitances.

Figure 5:
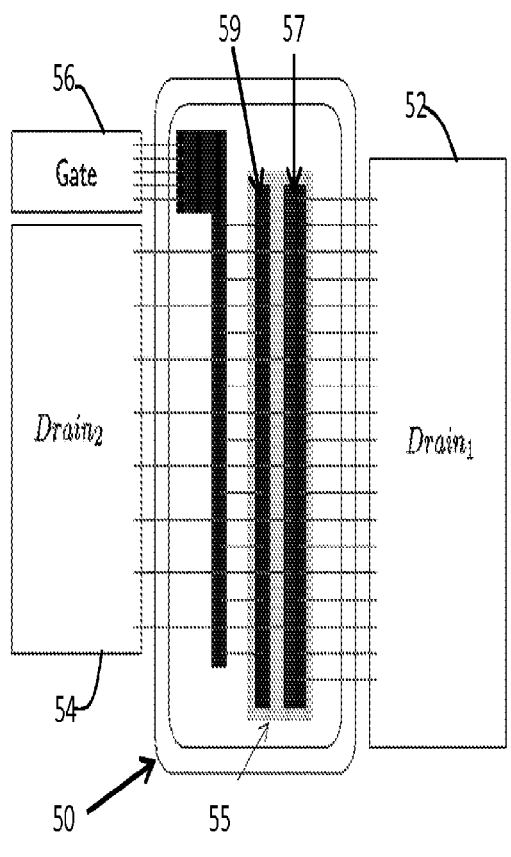
FIG. 5 shows a first physical layout for the peaking amplifier.
Figure 6:
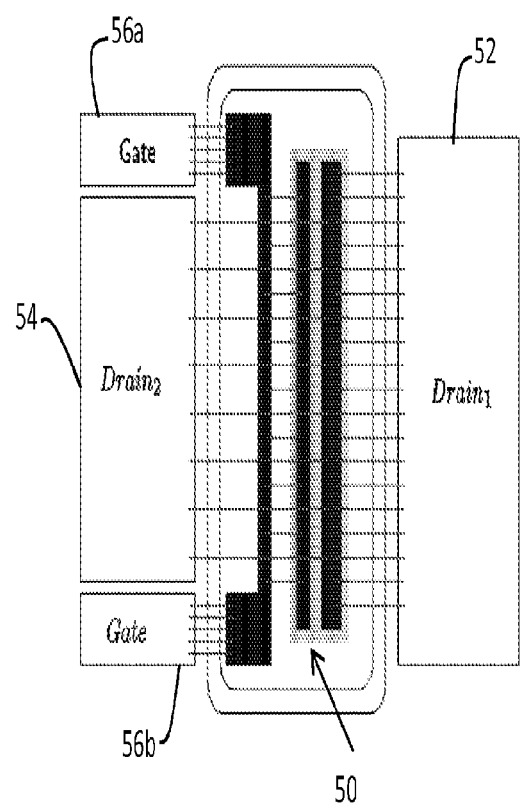
FIG. 6 shows a second physical layout for the peaking amplifier.

The assembly of the package is shown in FIGS. 5 and 6, and the assembly is designed to ensure uniform loading of the different cells in the RF power bar and RF losses will be reduced.

FIG. 5 shows a first assembly.

The RF power transistor 50 has a gate bar and a drain bar. The drain bar has a first set of connections to a first drain pad 52 on one side of the power amplifier transistor and a second set of connections to a second drain pad 54 on the opposite side. A single gate pad 56 connects to the gate bar.

The bottom of the transistor structure is the source and is attached to the flange of the package. The source is shown as the region 55. The drain bar of the transistor is shown a 57 and the gate bar is shown as 59.

FIG. 6 shows a second assembly, which differs from FIG. 5 only in that there is a double gate feed with two gate pads 56a,56b.

Figure 7:
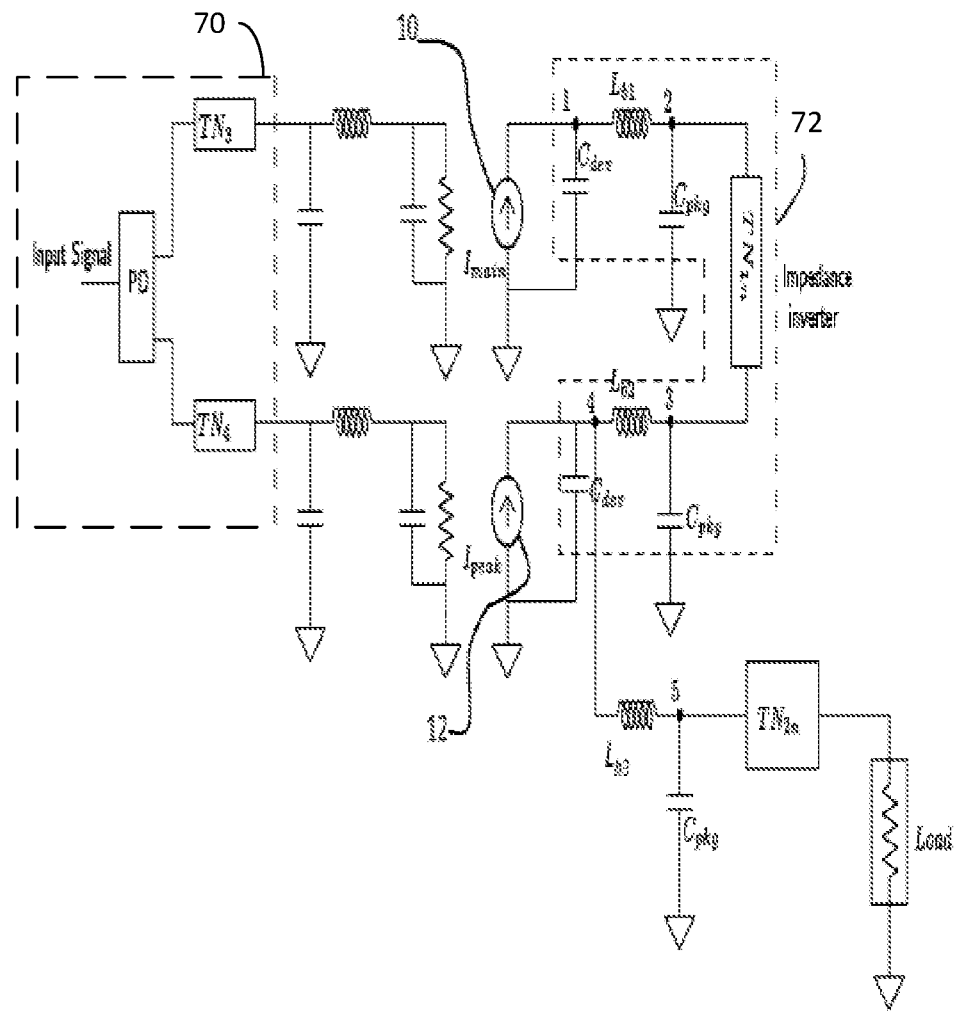
FIG. 7 shows a component layout for a packaged two way Doherty power amplifier circuit of the invention.

The complete circuit diagram of the modified Doherty PA using the peaking device of the invention is shown in FIG. 7. This shows five nodes numbered 1 to 5.

The general structure is the same, with an input network 70 connecting the Doherty amplifier input to the input of the main amplifier 10 and to the input of the at least one peaking amplifier 12, and an output network connecting an output of the main amplifier and an output of the at least one peaking amplifier to the Doherty amplifier output, Only one of the drain outputs of the peaking device (node 3) is used with the output of the main device (node 2) to form the impedance inverter 72. This includes a network $TN_{1n}$. Any kind of impedance inverter (wideband impedance inverter or multi-band impedance inverter) can be formed by choosing the proper characteristics of the network $TN_{1n}$.

The network $TN_{1n}$ is designed such that the impedance inverter formed by the network and the package parasitics of the main and peaking device (Lb1, Lb2, Cpkg) has a characteristic impedance equal to the real optimum loading conditions of the main power amplifier device.

Thus, the design of the network $TN_{1n}$ takes account of the parasitics at the first drain output.

This structure has no impedance transformation before power combining. For example if the optimum load of the PA devices is Ropt, the characteristic impedance of the quarter wave transmission line formed by TN1n, Lb, Cpkg and Cdev should be also equal to Ropt so the transmission line does not perform any impedance transformation.

The power combining of the main and peaking devices 10,12 really occurs at the internal device node (node 4).

The second output of the peaking device (node 5) is used to connect to the RF load through an impedance transformation network $TN_{2n}$.

The nodes 2,3 and 5 define the package terminals of the device. The capacitance Cpkg is the drain lead capacitance at each package terminal and Lb1, Lb2 and Lb3 are the bondwire inductances.

The characteristics of the network $TN_{2n}$ can be chosen in such a way that it provides the wideband impedance transformation over the desired bandwidth.

Thus, the design of the network $TN_{2n}$ takes account of the parasitics at the second drain output, and the design can be independent of the design of the impedance inverter 72.

TN1 n is a transmission line with a certain impedance and electrical length such that it forms a quarter wave transmission line along with the parasitic of the drains of the main and peaking devices. TN2n can be any wideband impedance matching circuit.

Figure 8:
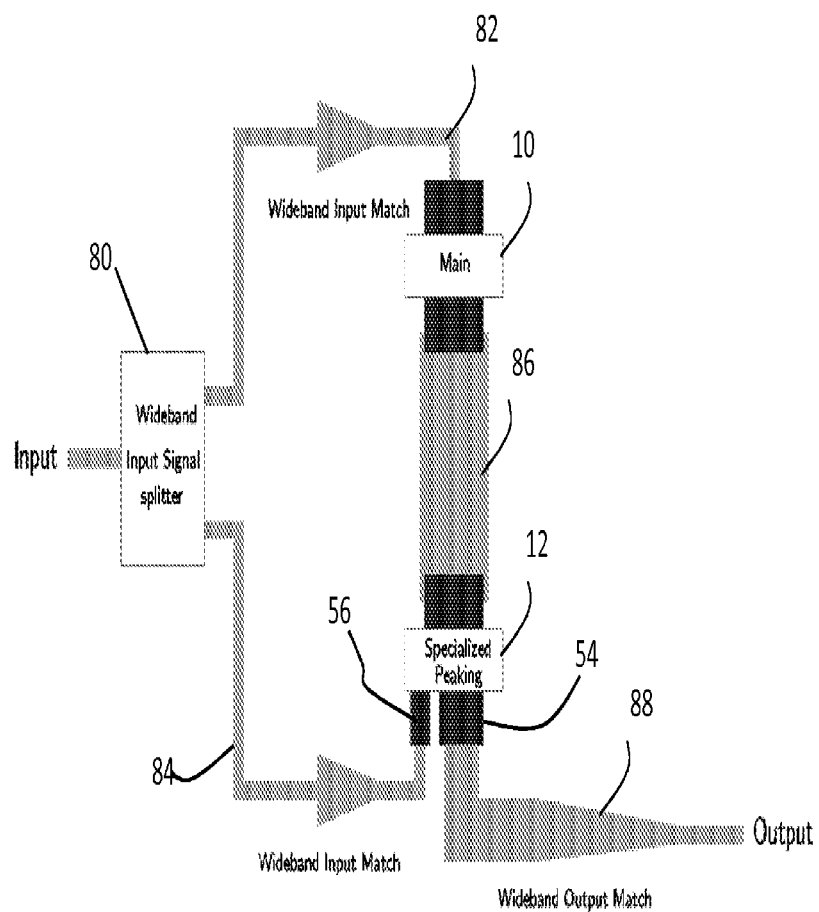
FIG. 8 shows a physical layout for the whole Doherty amplifier.

FIG. 8 shows one possible layout of a wideband broadcast power amplifier using the peaking amplifier of the invention.

The input is provided to a wideband input signal splitter 80. Wideband input matching transmission lines 82, 84 connect to the main amplifier 10 and peaking amplifier 12. The transmission lines 82,84 provide the relative phase shifting of the input signal before amplification.

The main amplifier and peaking amplifier have drain pads facing each other, in particular, the first drain pad 52 of the peaking amplifier. The impedance inverter is formed as a transmission line 86 between these drain pads, and this defines the impedance $TN_{1n}$ of FIG. 7. The second drain pad 54 of the peaking amplifier 12 connects to the output load through a wideband output matching impedance 88, which defines the impedance $TN_{2n}$ of FIG. 7.

Figure 9:
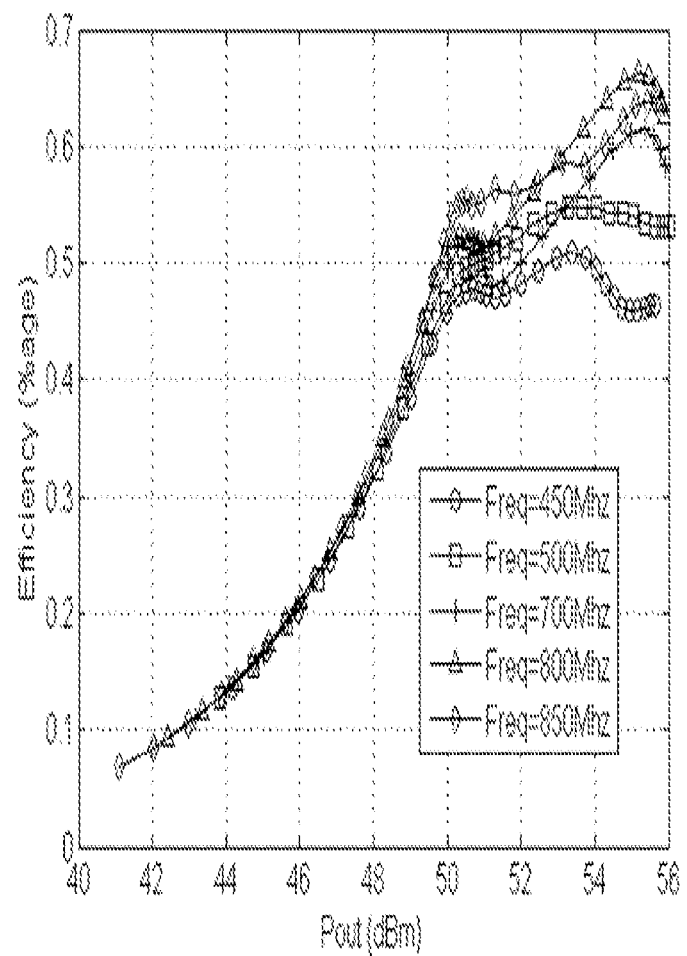
FIG. 9 shows the efficiency as a function of output power at different frequencies.

FIG. 9 shows a simulation of a broadcast Doherty power amplifier using the arrangement of FIG. 8, from 450 Mhz to 850 Mhz.

As mentioned above, the invention enables the wideband impedance inverters as disclosed in US 2012/0126890 to be used.

Figure 10A:
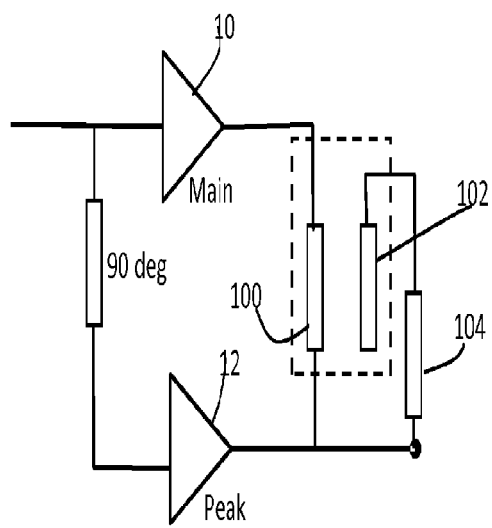
FIGS. 10a and 10b show different possible impedance inverters that can be used in the circuit.
Figure 10B:
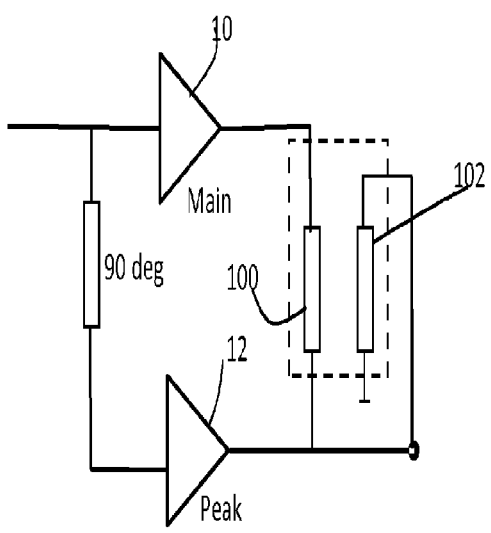

FIGS. 10a and 10b show examples of the impedance inverter. In each case, it comprises the basic impedance inverter 100 and another electromagnetically coupled transmission line 102 which also connects to the an output node. The power combiner stage thus has two coupled transmission lines, each having a quarter wavelength based on the centre frequency of the amplifier.

By "coupled" is meant that they share a common electric and magnetic field.

The coupled lines 100,102 may be characterised by their even and odd mode impedances or alternatively by their geometrical dimensions. The transmission lines 100,102 may for example be implemented as symmetric strip lines or asymmetric micro strip lines.

FIG. 10a shows an optional third transmission line 104 with a length of at least a quarter wavelength connected between the second transmission line 102 of the coupled pair and the output node, which is thus also connected to the output of the main amplifier stage 12. In FIG. 10a, one end of the transmission line 102 is open circuit.

The third transmission line 104 may also be implemented be as symmetric strip lines or asymmetric micro strip lines.

In an alternative embodiment shown in FIG. 10b, the third transmission line may is absent, and replaced by a short circuit, and the open end of the second transmission line 102 is connected to ground.

The impedances of the transmission lines may be chosen such that the even and odd mode impedances of the coupled lines are 80Ω (Zoe, or even mode impedance) and 44ψ (Zoo, or odd mode impedance), and the impedance of the transmission line 75Ω, and the electrical length of each of the lines selected to be one quarter wavelength. Other impedance values may alternatively be selected.

Figure 1:
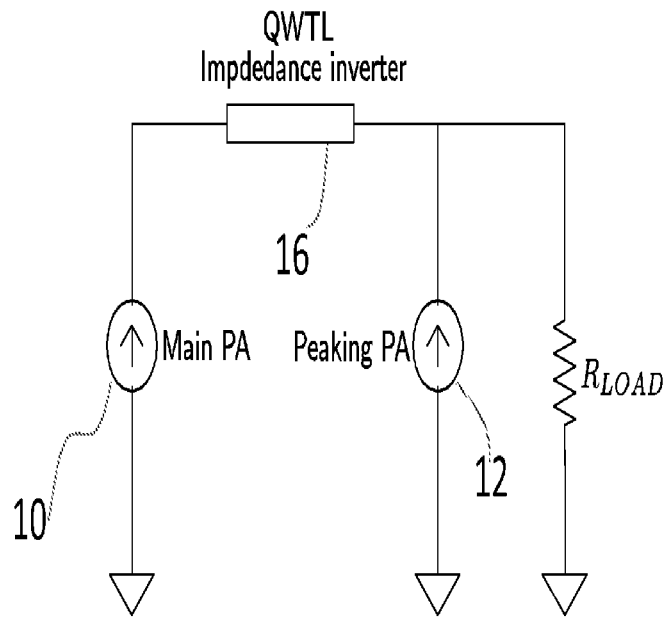
FIG. 1 shows an equivalent circuit for the basic known two way Doherty Power Amplifier.
Figure 2:
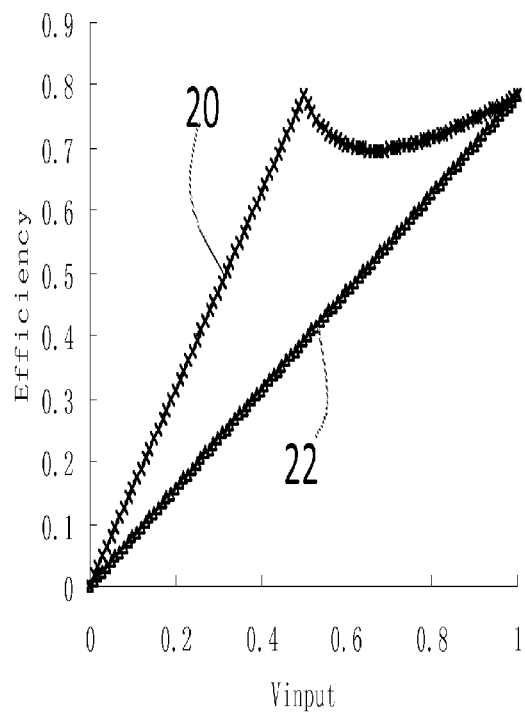
FIG. 2 compares the efficiency of the Doherty PA of FIG. 1 with an ideal Class-B amplifier.

When using this wideband impedance inverter with the basic schematic of FIG. 1, the bandwidth of the Doherty PA can be further improved.

The invention also enables the dual band inverters presented in the paper "A small dual-frequency transformer in two sections", C Monzon, IEEE Trans. on Microwave Theory and Tech. vol 51, April 2003, pp 1157-1161 to be used.

The idea can be applied to the high-power amplifiers for cellular base-stations as well as multi-band broadcast amplifiers.

The structure of the invention facilitates bandwidth improvement by allowing power combining in the Doherty amplifier at the peaking transistor die, thus eliminating the need for any additional network. The Doherty combiner is formed with the parasitics of the package.

Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measured cannot be used to advantage. Any reference signs in the claims should not be construed as limiting the scope.

The invention claimed is:

1. A Doherty amplifier for driving a load comprising:
   a main amplifier package, comprising a main amplifier and a drain connection connecting a drain of the main amplifier to an output lead of the main amplifier package;
   a peaking amplifier package, comprising a peaking amplifier, a first drain connection connecting a drain of the peaking amplifier to a first output lead of the peaking amplifier package, and a second drain connection connecting the drain of the peaking amplifier to a second output lead of the peaking amplifier package different from the first output lead;
   an input network connecting an input of the Doherty amplifier to an input lead of the main amplifier package and to an input lead of the peaking amplifier package; and
   an output network connecting the output lead of the main amplifier package and the first output lead of the peaking amplifier package;
   wherein the output network, the drain capacitance of the main amplifier and the peaking amplifier, parasitics associated with the drain connection and output lead of the main amplifier package, and parasitics associated with the first drain connection and first output lead of the peaking amplifier package form an impedance inverter; and
   wherein, during operation, the second output lead is connected to the load.

2. The amplifier as claimed in claim 1, wherein the drain connection of the main amplifier package comprises bondwires extending between the output lead of the main amplifier package and a drain bar of the main amplifier, and wherein the parasitics associated with the drain connection and output lead of the main amplifier package comprise an inductance associated with the bondwires that extend between the output lead of the main amplifier package and the drain bar of the main amplifier and a capacitance associated with the output lead of the main amplifier package.

3. The amplifier as claimed in claim 2, wherein the first drain connection of the peaking amplifier package comprises bondwires extending between the first output lead of the peaking amplifier package and a drain bar of the peaking amplifier, and wherein the parasitics associated with the first drain connection and the first output lead of the peaking amplifier package comprise an inductance associated with the bondwires that extend between the first output lead of the peaking amplifier package and the drain bar of the peaking amplifier and a capacitance associated with the first output lead of the peaking amplifier package.

4. The amplifier as claimed in claim 3, wherein the output network comprises a transmission line with an impedance and electrical length such that it forms a quarter wave transmission line along with the inductances associated with the drain connection of the main amplifier package and the first drain connection of the peaking amplifier package, with the capacitances associated with the first output lead of the peaking amplifier package and with the output lead of the main amplifier package, and with the drain capacitances of the main amplifier and the peaking amplifier.

5. The amplifier as claimed in claim 1, wherein the first and second output leads of the peaking amplifier package are arranged on opposite sides of the package.

6. The amplifier as claimed in claim 1, comprising an impedance transformation network between the second drain connection and the load.

7. The amplifier as claimed in claim 6, wherein the impedance transformation network comprises a wideband impedance matching circuit.

8. A radio frequency transmitter comprising a Doherty amplifier as claimed in claim 1.

9. An integrated circuit comprising a Doherty amplifier as claimed in claim 1.

* * * * *